United States Patent
Costello et al.

(10) Patent No.: US 11,621,289 B2
(45) Date of Patent: Apr. 4, 2023

(54) COMPACT PROXIMITY FOCUSED IMAGE SENSOR

(71) Applicant: EOTech, LLC, Plymouth, MI (US)

(72) Inventors: Kenneth Costello, Santa Clara, CA (US); Kevin Roderick, Santa Clara, CA (US); Verle Aebi, Santa Clara, CA (US)

(73) Assignee: EOTech, LLC, Plymouth, MI (US)

( * ) Notice: Subject to any disclaimer, the term of this patent is extended or adjusted under 35 U.S.C. 154(b) by 406 days.

(21) Appl. No.: 16/881,946

(22) Filed: May 22, 2020

(65) Prior Publication Data

US 2021/0366972 A1 Nov. 25, 2021

(51) Int. Cl.

| *H01L 27/146* | (2006.01) |
|---|---|
| *H01J 31/26* | (2006.01) |
| *H01J 1/34* | (2006.01) |
| *H01J 29/86* | (2006.01) |
| *H01J 29/96* | (2006.01) |
| *H01J 31/50* | (2006.01) |

(52) U.S. Cl.
CPC ......... *H01L 27/14636* (2013.01); *H01J 1/34* (2013.01); *H01J 29/861* (2013.01); *H01J 29/96* (2013.01); *H01J 31/26* (2013.01); *H01J 31/506* (2013.01); *H01L 27/14634* (2013.01)

(58) Field of Classification Search
CPC .......... H01L 27/14636; H01L 27/14634; H01J 1/34; H01J 29/861; H01J 29/96; H01J 31/26; H01J 31/506
See application file for complete search history.

(56) References Cited

U.S. PATENT DOCUMENTS

| 6,847,027 B2 * | 1/2005 | Iosue ................... H01J 31/507 250/214.1 |
|---|---|---|
| 9,734,977 B2 | 8/2017 | Costello et al. |
| 2011/0261239 A1 * | 10/2011 | Costello ................. B23K 1/19 156/60 |
| 2013/0330995 A1 | 12/2013 | Fike, III et al. |
| 2016/0343532 A1 * | 11/2016 | Chuang ................ H01L 31/105 |
| 2017/0018391 A1 * | 1/2017 | Costello .................... H01J 1/34 |
| 2019/0080875 A1 * | 3/2019 | Costello ................. H01J 29/04 |

OTHER PUBLICATIONS

International Search Report for application No. PCT/US2021/033948, dated Aug. 31, 2021, 2 pp.

* cited by examiner

*Primary Examiner* — Anne M Hines
(74) *Attorney, Agent, or Firm* — Bodman PLC

(57) ABSTRACT

An image sensor has a photocathode window assembly, an anode assembly, and a malleable metal seal. The photocathode window assembly has a photocathode layer. The anode assembly includes a silicon substrate that has an electron sensitive surface. The malleable metal seal bonds the photocathode window assembly and the silicon substrate to each other. A vacuum gap separates the photocathode layer from the electron sensitive surface. A first electrical connection and a second electrical connection are for a voltage bias of the photocathode layer relative to the electron sensitive surface.

18 Claims, 6 Drawing Sheets

Compact Proximity Focused Vacuum Image Sensor

Proximity Focused Vacuum Image Sensor as disclosed in Fig. 3 of US Patent 7,012,328 B2

COMPACT PROXIMITY FOCUSED IMAGE SENSOR

TECHNICAL FIELD

The technical field of the present disclosure relates to image sensors, and more specifically photocathode based proximity focused image sensors.

BACKGROUND

Image sensors and photocathodes for image sensors come in a wide variety of types and subclasses. Many of the early night image intensifiers employed Multialkali Antimonide Photocathodes as described by Sommer in Photoemissive Materials, A. H. Sommer, Robert E. Krieger Publishing Company, Huntington, N.Y., 1980. Modern versions of these photocathodes account for a significant fraction of the image intensifiers sold and in use today. In the 1950s, research on a new class of photocathodes was anchored and accelerated when William E. Spicer reported a detailed photocathode model in Phys. Rev. 112, 114 (1958) to give understanding of photocathode device physics and permit engineering of photocathodes for specific performance characteristics. This disclosure can be of use with a wide variety of photocathodes. However, the disclosure is particularly applicable to the glass-bonded, epitaxially grown, single crystal, III-V semiconductor photocathodes. GaAs, GaAsP, InP/InGaAsP and InP/InGaAs based photocathodes have all been demonstrated using glass-bonded windows which form a portion of the image sensor vacuum enclosure.

One constraint associated with the previously cited glass bonded III-V semiconductor photocathodes is that the thermal coefficient of expansion (TCE) of the glass bonded window must closely match that of the semiconductor used in the photocathode structure. A significant mismatch in thermal expansion coefficient results in degraded photocathode performance as a result to the thermal budget associated with the manufacturing process. Antypas et al. lay out the requirements for glass-bonded III-V semiconductor photocathodes in U.S. Pat. No. 3,769,536. Antypas expands on and further details the photocathode and window assembly fabrication process in U.S. Pat. No. 3,959,045. Both cited Antypas patents are incorporated into the background of this patent via reference. Corning code 7056 glass has been shown to be a suitable window material for glass bonding for GaAs/AlGaAs, InP/InGaAs and InP/InGaAsP based photocathodes. The combination of the photocathode material, the glass window and any conductive paths formed in or on the window may be referred to as a photocathode window assembly. It is in the context and environment of these and further photocathodes that present embodiments arise, to improve upon and address drawbacks in known photocathode and image sensor technology.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

One embodiment of a vacuum proximity focused image sensor includes a photocathode window assembly, an anode assembly, a malleable metal seal, a first electrical connection and a second electrical connection. The photocathode window assembly has a face with one or more raised features and a photocathode layer. The anode assembly includes a silicon substrate that has an electron sensitive surface. The malleable metal seal bonds the photocathode window assembly and the silicon substrate to each other. This bonding forms a vacuum gap that separates the photocathode layer of the photocathode window assembly and the electron sensitive surface of the silicon substrate of the anode assembly. The vacuum gap separates the photocathode layer and the electron sensitive surface by a gap height that is defined by the one or more raised features of the face of the photocathode window assembly. The first electrical connection is to the photocathode layer, for a voltage bias. The second electrical connection is to the electron sensitive surface, for the voltage bias.

One embodiment of a vacuum proximity focused image sensor includes a photocathode window assembly, an anode assembly, a malleable metal seal, a first electrical connection and a second electrical connection. The photocathode window assembly has a photocathode layer. The anode assembly includes a silicon substrate that has an electron sensitive surface. The malleable metal seal bonds the photocathode window assembly and the silicon substrate to each other. This bonding forms a vacuum gap that separates the photocathode layer of the photocathode window assembly and the electron sensitive surface of the silicon substrate of the anode assembly. The vacuum gap has a gap height defined by thickness of the malleable metal seal. The first electrical connection is to the photocathode layer, and is for a voltage bias. The second electrical connection is to the electron sensitive surface, and is also for the voltage bias.

One embodiment of an image sensor includes a photocathode window assembly, an anode assembly, a malleable metal seal, a first electrical connection and a second electrical connection. The photocathode window assembly has a photocathode layer. The anode assembly includes a silicon substrate that has an electron sensitive surface. The malleable metal seal bonds the photocathode window assembly and the silicon substrate to each other, forming a vacuum gap that separates the photocathode layer of the photocathode window assembly and the electron sensitive surface of the silicon substrate of the anode assembly. The first electrical connection is to the photocathode layer. The second electrical connection is to the electron sensitive surface. The first electrical connection and the second electrical connection are for voltage bias of the photocathode layer relative to the electron sensitive surface.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Embodiments of the inventive proximity focused image sensor will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

A photocathode based proximity focused vacuum image sensor geometry is described herein, in various embodiments that have a minimalistic vacuum packaging architecture. This approach reduces sensor cost, size and weight: parameters critical for applications including head mounted systems and small unmanned ground and aerial systems.

The image sensor vacuum envelope is formed between a photocathode window assembly and a silicon based, electron sensitive image sensor directly bonded via a malleable metal seal, thereby generating a vacuum envelope. The malleable metal seal is shown to reliably accommodate significant thermal coefficient of expansion mismatches between the photocathode window assembly and the silicon based image sensor. The vacuum seal is located to allow the silicon based image sensor electrical connections to be accessed outside of the vacuum envelope. This approach eliminates the need for a separate vacuum body component thereby minimizing image sensor part count, size weight and cost.

Figure 1A:
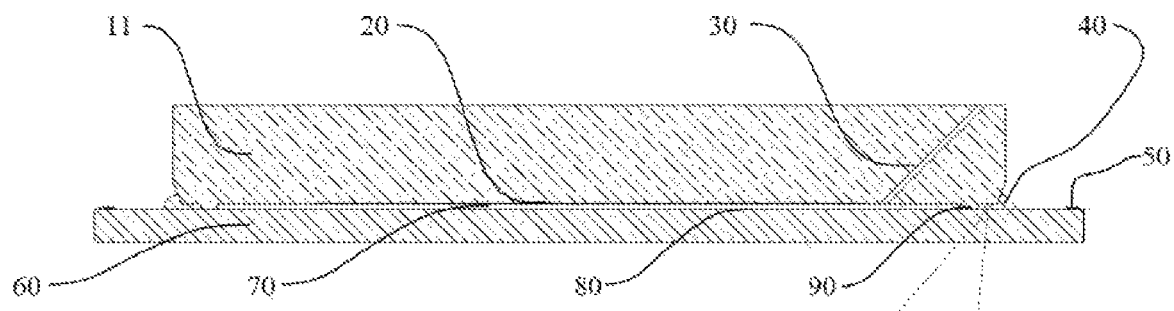
FIG. 1A depicts a compact proximity focused vacuum image sensor in accordance with an embodiment of the present disclosure.

FIG. 1A depicts a compact proximity focused vacuum image sensor in accordance with an embodiment of the present disclosure. The image sensor, also called a silicon image sensor, silicon-based image sensor, imager, imaging sensor, or imaging device, includes a photocathode window assembly 11 and an anode assembly 60, with these two components assembled together and defining a vacuum gap 70. The term image sensor may also apply to just the anode assembly 60, or just the semiconductor device in the anode assembly 60, in various contexts. The photocathode window assembly 11 has a photocathode layer 20, and the anode assembly 60 is (or at least includes) a silicon substrate that has an electron sensitive surface 80, in various embodiments. The thermal coefficient of expansion of III-V semiconductor photocathodes, such as used in embodiments of the photocathode layer 20 of the photocathode window assembly 11, significantly exceeds the thermal coefficient of expansion of silicon, such as used in the anode assembly 60, in various embodiments. Consequently, a significant thermal coefficient of expansion mismatch exists between that of the III-V glass bonded photocathode window assembly 11 and that of the anode assembly 60, for the image sensor embodiment depicted in FIG. 1A. Accommodating the TCE mismatch, such as between the silicon image sensor anode assembly 60 and the III-V photocathode window assembly 11, in a reliable manner, is a well-established issue for other, known proximity focused image sensors.

Figure 1B:
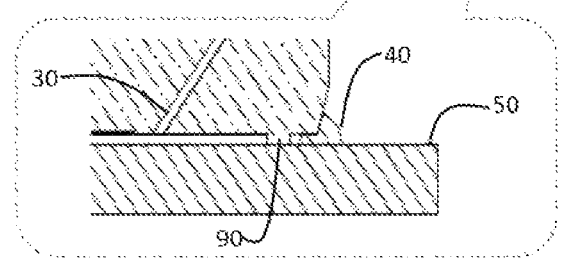
FIG. 1B depicts a known proximity focused vacuum image sensor, for comparison and contrast with FIG. 1A.

FIG. 1B depicts a known proximity focused vacuum image sensor, for comparison and contrast with FIG. 1A. Known image sensors, e.g., as shown in FIG. 1B based on disclosure in U.S. Pat. No. 7,012,328 B2, typically employ a ceramic body primarily composed of Aluminum Oxide in order to closely approximate the TCE of the III-V semiconductor bonded photocathode window. U.S. Pat. No. 7,012,328 B2 is hereby incorporated by reference. Whereas, this design choice minimizes the thermally induced strain across the vacuum seal between the window and the ceramic body, it nonetheless leaves a TCE mismatch between the ceramic body and that of the silicon based image sensor. U.S. Pat. No. 6,281,572 B1, by William L. Robbins, describes one approach to accommodate the thermal expansion difference between the silicon of the Electron Bombarded Charge Coupled Device (EBCCD) image sensor and the Alumina header (a portion of the ceramic body, which forms the sensor vacuum envelope). Alternately, in FIG. 3 of U.S. Pat. No. 7,012,328 B2 (here copied as FIG. 1B), the TCE mismatch is accommodated via a malleable braze material 29 used to attach the silicon based image sensor, semiconductor device 10, to the ceramic body of package 17 where indium layer 45 is further identified as an appropriate braze material. Photocathode 41 is pressed into the indium layer 45 that seals to another portion of the package 17.

Unlike the silicon image sensor to ceramic body braze detailed in U.S. Pat. No. 7,012,328 B2 which is formed via a thermal melt cycle, the malleable metal seal depicted in the current invention is achieved via a cold compression bond. Additionally, it should be noted that while the bonds in U.S. Pat. No. 7,012,328 B2 need only maintain electrical conductivity, the current inventive sensor geometry requires the bond to also form an ultra-high vacuum seal to maintain the ultra-high vacuum environment present in a typical photocathode, including GaAs photocathode, based image sensor. Leak tight vacuum seals require both a lack of cracking and surface interfaces that do not form any connected voids that bridge the vacuum seal. Historically, cold compression seals particularly between a hard surface like glass and a malleable metal exhibit lower bond strengths than those of a braze where the two surfaces to be joined are wet by a molten metal. It should be noted that III-V photocathodes are typically activated via a thin layer of reactive materials such as CsO. These layers are thermally sensitive and therefore, are incompatible with manufacturing processes that require a vacuum seal melt cycle to occur after the activation layer has been generated. Consequently, as shown in the previously cited prior art vacuum sensor design examples, care was taken to minimize TCE induced shear stress across the compression-formed vacuum seal. Recent internal testing at Intevac has demonstrated that with proper surface preparation, sufficient bond strength can be achieved in a glass-to-indium compression bond to resist the TCE induced stress placed on the bond through the projected thermal cycling that a proximity focused image sensor will see during the image sensor manufacturing process and throughout a projected useful lifetime.

An additional distinction between the currently disclosed embodiments and known proximity focused image sensors is that known image sensors incorporate an electrical contact layer, typically a metallization layer which bridges and electrically connects the active photocathode area to the annular vacuum seal. In the disclosed sensor geometry, the vacuum seal overlies the silicon image sensor which constitutes the anode of the vacuum photodiode shown in FIG. 1A. The voltage applied between the photocathode and the next proximity focused element in the image sensor typically falls in the 200 to 2000V range. Depositing a dielectric over the surface of the silicon image sensor capable of standing off the photocathode voltage presents technical challenges both with respect to low cost manufacturability and high voltage stand-off reliability. Consequently, the newly disclosed sensor geometry makes use of one or more conductive electrical paths formed through the photocathode window. This alternate routing of the photocathode bias voltage allows the vacuum seal to remain at the electrical potential of the image sensor anode surface. The photocathode-to-silicon sensor surface voltage drop is held off on the inner vacuum surface of the photocathode window over an annulus that separates the vacuum seal from the active area of the photocathode. This area may be bare glass or it may be coated with a high resistivity coating. U.S. Pat. No. 4,604,545 describes a chrome oxide layer, in the $10^{12}$ to $10^{15}$ Ohms per square range, suitable for high voltage stand-off U.S. Pat. No. 3,729,575 details an alternate mixed oxide coating. Any high resistivity coating compatible with the ultra-high vacuum sensor requirements may be used over this area. The conductive path through the window may either directly contact the photocathode or a conductive film, typically a deposited metal layer may be used to connect the conductive path to the photocathode material.

Methods to achieve electron sensitivity on a backside-illuminated silicon image sensor are well known to those skilled in the art. Sexton et al. detail one of the older methods of passivating the back surface of a silicon imager in U.S. Pat. No. 5,688,715A. A more recent patent that describes a wafer level, efficient, silicon wafer backside processing approach is detailed in U.S. Pat. No. 8,828,852 B2 by Hoenk et al. Yet another approach is to directly detect electrons incident upon metal pads disposed on a silicon based image sensor as described by Benz et al. in U.S. Pat. No. 7,015,452 B2. This disclosure may make use of any appropriate method or approach that results in an electron sensitive silicon based image sensor.

Proximity focused sensors rely on a small uniform photocathode-to-image sensor anode spacing or gap in order to achieve high-resolution image transfer between the photocathode and the image output means. The image output means can constitute a wide variety of potential image sensors. The list includes but is not limited to:

Electron sensitive CCDs (including phosphor coated light-sensitive devices, applies to all classes of sensor)
Electron sensitive CMOS imagers
Electron sensitive resistive position sensing imagers
Electron sensitive read-out integrated circuits (ROICs)
Time-stamped electron sensitive imagers The elimination of the ceramic body from the proximity focused image sensor of the prior art presents certain tolerancing advantages. Indexing the photocathode directly to the silicon image sensor eliminates the tolerance stack-up associated with using the ceramic body to support both the silicon imager and the photocathode. The disclosed design is shown in FIG. 1A with spacers molded into the photocathode window assembly 11 as raised feature 90 to allow direct indexing between the photocathode window assembly 11 and the anode assembly 60 of the electron sensitive silicon imager. This raised feature 90 allows accurate photocathode-to-silicon imager vacuum gap control.

With continuing reference to FIG. 1A, a proximity focused imager geometry, or image sensor, is disclosed in which according to a first aspect of the disclosure, the photocathode window assembly 11 is directly bonded to the anode assembly 60 via a malleable vacuum seal 40. According to a second aspect of the invention, the photocathode window assembly 11 incorporates means to bias the photocathode layer 20, in this embodiment conductive path 30 through the photocathode window assembly 11, so as to permit the malleable vacuum seal 40 material to remain at or near the bias potential of the vacuum surface or electron sensitive surface 80 of the anode assembly 60 of the image sensor.

The thermal coefficient of expansion (TCE) mismatch between the photocathode window assembly 11 and the anode assembly 60 results in stress upon the malleable vacuum seal 40. Initial prototypes were generated using Corning code 7056 glass windows and 725 micron thick back side illuminated CMOS silicon imagers. The indium seal spans a 19 mm horizontal span. Vacuum seals were generated via a room temperature compression seal that compressed the indium bead from an initial height of ~20 mils to a final thickness of ~3.5 mils. Whereas, initial samples showed vacuum leaks when stressed via thermal cycling form ~54 C to +71 C, improved glass surface preparation techniques yielded samples which survived >1000 thermal cycles without a measurable vacuum leak. The surface preparation step that first yielded sufficiently increased bond strength to handle the TCE induced stress was a relatively strong oxygen plasma applied to the 7056 glass window over that surface that was pressed into the indium bead. Care must be taken not to recontaminate the glass surface via contact or via extended atmospheric exposure after plasma treatment. Whereas, the plasma treatment of the glass was demonstrated to support the generation of an indium-glass compression bond with sufficient bond strength to make the disclosed geometry feasible and reliable, there are a variety of methods that can generate seals with sufficient bond strength. This disclosure is focused on the geometry of the sensor not the method of manufacture. The geometry has been shown to be feasible for photocathode window assemblies of up to at least 19 mm square and about 27 mm diagonal dimensions. This size of image intensifier meets commercially important requirements. The upper limit for this image intensifier has not been established but it appears that the standard image intensifier format supporting an 18 mm active area should be achievable.

One of the differences between the disclosed geometry of the image sensor and that of other known image sensors is that the silicon image sensor becomes part of the vacuum envelope. In addition to the requirement to be leak tight, the silicon must also resist the physical force applied by atmospheric pressure. Current cost effective image sensors are typically produced at foundries on either 200 mm or 300 mm diameter silicon wafers. The SEMI standard silicon thickness for 200 and 300 mm silicon wafers are ~725 and ~775 microns respectively. Finite element analysis was performed to look at the physical deflection and the peak strain present in the disclosed geometry sensor for the thinner standard wafer thickness of 725 microns. Modeling demonstrated that the peak center deflection of the silicon was less than 5 microns for the modeled geometry and that the peak strain was less than 10% of the yield strength of silicon. A significant safety margin should be incorporated into the design, particularly for sensors that will be exposed to extended thermal excursions after the generation of the vacuum seal. Based on the modeling results, use of cost-effective, standard thickness silicon wafers is shown to be suitable for sensors of the disclosed geometry. No yield loss associated with atmosphere induced silicon substrate failure or thermally induced silicon substrate failure have been observed in initial prototype sensors that make use of the novel disclosed geometry.

Figure 1B:
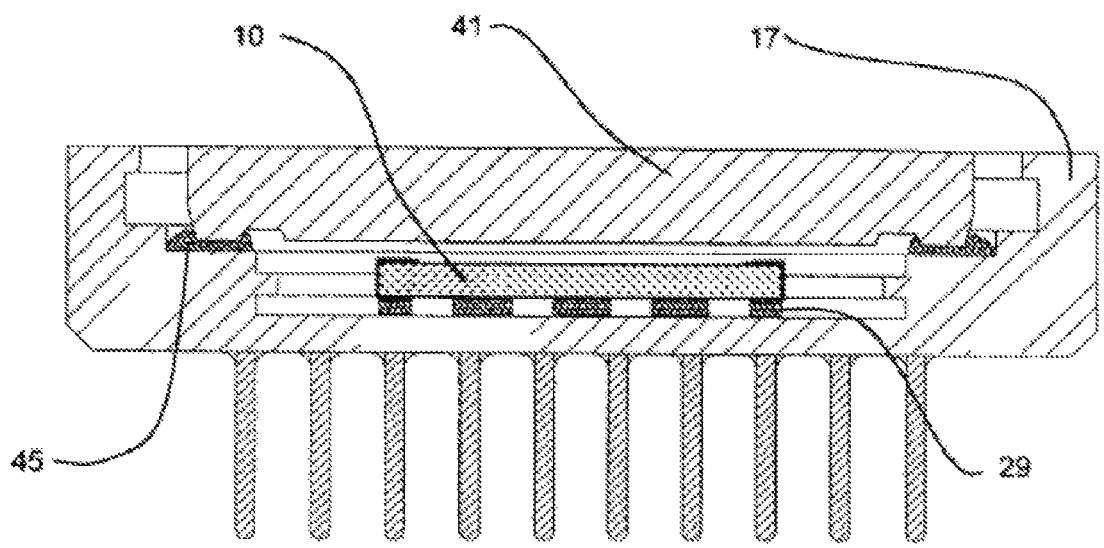

FIG. 1A introduces the use of a conductive path 30 through the photocathode window assembly 11 and connecting to the photocathode layer 20. Prior art proximity focused image sensors beneficially use the low cost approach of a surface metallization to connect the photocathode active area, i.e., photocathode layer 20, to a point accessible outside the vacuum envelope. Whereas, the use of a surface metallization is acceptable for a proximity focused image sensor using an insulating or a highly resistive body, in the presently disclosed geometry it presents very significant issues. Though it would be possible to build up a dielectric layer on the surface of anode assembly 60, experience has shown that it is difficult to generate a large area layer capable of reliably standing off the high voltage bias required by the image intensifier. Consequently, a conductive path 30 connecting to the photocathode layer 20 through the photocathode window assembly 11 is preferred. Requirements for this conductive path 30 are set by the intended use of the image sensor. If rapid high voltage swings are required, typical of a "gated" imaging scenario, a low impedance conductive path is required. Those skilled in the art can determine the required impedance based on a variety of parameters, including but not limited to, capacitance, geometry, high voltage slew time, total voltage change, illumination level and the repetition rate of the high voltage switching. Based on the calculations noted above, requirements can change by many orders of magnitude. Although a single conductive path 30 is shown, multiple conductive paths may be required. The use of multiple conductive paths also facilitates options like the use of multiple terminal photocathode structures such as those described in U.S. Pat. No. 5,047,821. Similarly, multiple conductive paths could be used to selectively bias portions of a segmented photocathode. In one embodiment shown in FIG. 1A, a single conductive path 30 is shown. Multiple approaches may be used to generate a conductive path 30 through an insulating photocathode window assembly 11. Corning Code 7056 glass has been shown to be a suitable window material for use in the manufacture of glass bonded GaAs photocathodes. Whereas, numerous methods may be used to generate a conductive path such as the use of conductive oxides, laser drilling the window and back filling with a metal layer, when making use of window glasses with thermal coefficients of expansion similar to GaAs, a more cost effective option exists. As depicted in FIG. 1 of U.S. Pat. No. 2,177,360, a proximity-focused image intensifier may be biased via electrical wires fed directly through a transparent (glass) vacuum vessel. Although, modern proximity-focused image sensor manufacturers do not practice the art, vacuum-tight wire feedthroughs through a glass surface remain a cost effective option. Manufacturing methods have been established, and are known to those skilled in the art, to achieve reliable vacuum seals between Kovar™ wire and Corning Code 7056 glass. KOVAR is a trademark assigned to Carpenter Technology Corporation. Kovar is composed by weight of ~29% Ni, 17% Co, <0.01% C, 0.2% Si, 0.3% Mn and the balance of Fe. Fe—Ni—Co alloys of similar composition are acceptable alternatives to Kovar™ wire. One embodiment shown in FIG. 1A depicts a conductive path 30, formed from a single Kovar™ wire.

Alternately, materials with lower thermal coefficients of expansion approaching that of silicon such as Invar have been successfully soldered to silicon and taken through extreme thermal cycles; J. Synchrotron Rad. (2019). 26, 1565-1571. A wide range of metal alloys are commercially available that span the thermal coefficient of expansion range of the cathode and anode assemblies described in this disclosure. A description of some of these alloys may be found at the Carpenter web site at carpentertechnology.com/en/alloy-techzone/technical-information/alloy-selection/selecting-controlled-expansion-alloys.

Embodiments of the compact geometry image sensor detailed below are presented as practical examples in order to aid in explanation of the invention, not to limit the scope of the present invention. Those skilled in the art are anticipated to use elements and teachings of this disclosure to craft equivalent compact sensors. Specific, envisioned variations include changing sensor image-plane width and height in order to meet specific format requirements as well as the use of through silicon vias to place the electrical contacts of the silicon image sensor on the side opposite that of the electron input; these variants remain within the scope of this disclosure.

Continuing with the description, FIG. 1A depicts an embodiment of a compact proximity focused vacuum image sensor. The photocathode window assembly 11 is directly joined to anode assembly 60 of the silicon based image sensor, by means of a malleable vacuum seal 40, and thereby forms the image sensor vacuum envelope that surrounds or encloses the vacuum gap 70. The photocathode layer 20 and the electron sensitive surface 80 form opposed faces of the vacuum envelope, opposing each other across the vacuum gap 70. The image sensor electrical connections, in the form of wirebond pads 50, access all image sensor electrical functionality required to power, control, monitor and read data out from the image sensor. The location of the image sensor wirebond pads 50 falls outside the vacuum envelope formed by the photocathode window assembly 11, the anode assembly 60 and the malleable vacuum seal 40. The routing of the image sensor electrical connections, one connection to the electron sensitive surface 80 of the anode assembly 60 and one connection to the photocathode layer 20 of the photocathode window assembly 11, to a location outside of the vacuum envelope is a key advantage of this sensor over known sensors in that it eliminates the need and thereby the cost to create a sensor component containing multiple vacuum electrical feed-through elements.

The photocathode window assembly 11, is formed from a material that is transparent to light in the wavelengths of interest. Typical choices for the window material include but are not limited to glass, quartz, sapphire and certain transparent, primarily ionic salts. In one embodiment, the photocathode window assembly 11 is composed primarily of Corning Code 7056 glass. In operation, light, typically is focused, from the top of FIG. 1A, through photocathode window assembly 11 onto photocathode layer 20 via an objective lens (not shown). The photocathode layer 20 may include but is not limited to a multialkali antimonide based photocathode, a III-V semiconductor based photocathode, a group IV photocathode or a perovskite photocathode. In one embodiment, photocathode layer 20 is composed of a glass-bonded, thermally assisted negative affinity photocathode (TANEA), transmission mode photocathode as described in US Patent Application Publication US2019/0080875 A1. The full publication of US2019/0080875 A1 is hereby incorporated by reference. The TANEA photocathode used with a GaAs optical absorber layer is suitable for use in the disclosed compact sensor geometry for applications requiring digital night vision imagery. Selected wavelengths of the incoming light are absorbed in photocathode layer 20 resulting in energetic electrons which have a finite probability of being emitted into the vacuum gap 70 that separates the photocathode layer 20 from the electron sensitive surface 80 of the silicon based anode assembly 60 in the image sensor.

In order to support photocathode electron emission and transit of the photoelectrons across the vacuum gap 70, a high bias voltage is applied between photocathode layer 20 and the electron sensitive surface 80 of the anode assembly 60, with the cathode biased negative with respect to the anode, or, equivalently, the anode biased positive with respect to the cathode. The high voltage bias reaches photocathode layer 20 via metallization layer 145 and conductive path 30 (see FIG. 2). Layer 145 is understood to be present in FIG. 1A but is not resolved at the scale of the drawing. Metallization layer 145 bridges the electrical connection between electrically conductive path 30 and photocathode layer 20. Consequently, the bias voltage applied to the conductive path 30 specifies the electrical potential of the photocathode layer 20.

As previously discussed, conductive path 30 is a leak tight conductive path that bridges the vacuum surface of photocathode layer 20 of photocathode window assembly 11 to the external surface of the photocathode window assembly 11. One end of the electrical connection to the photocathode layer 20, in this embodiment formed by metallization layer 145, is within the vacuum gap 70, and another end of the electrical connection to the photocathode layer 20, in this embodiment formed by the conductive path 30, is outside the vacuum gap 70 and vacuum envelope for external connection. In one embodiment, conductive path 30 is implemented with a Kovar™ wire sealed into the Corning Code 7056 glass window assembly. The wire, conductive path 30, is finished flush to the vacuum surface of the window assembly so as to minimize the chance of field emissions from the wire during sensor operation. Similarly, the point at which the conductive path 30 exits photocathode window assembly 11 is finished flush with the assembly surface so as to facilitate compact packaging of the sensor. On the external surface of photocathode window assembly 11 where conductive path 30 exits, a metallization pad 155 (FIG. 2) may be applied to ease reliable connection to an external high voltage power supply lead. Once again, metallization pad 155 is understood to be present in FIG. 1A but is unresolved due to the scale of the drawing.

Additional features visible in FIG. 1A include the electron sensitive surface 80 of the anode assembly 60. This electron sensitive surface 80 lies directly across vacuum gap 70 from photocathode layer 20. The intersection of the overlaid areas (in a plan view) of photocathode layer 20 and electron sensitive surface 80 of the silicon based image sensor specify the effective active area of the disclosed compact proximity focused image sensor.

The electron sensitive surface 80 of the anode assembly 60 of the silicon based image sensor, is specified at a bias voltage above that of photocathode layer 20 in order to attract photoelectrons across vacuum gap 70. Typical vacuum gaps range from 0.0015" to 0.020", one embodiment targets gaps in the range of 0.004" and 0.007". Electron sensitive surface 80 is typically specified at a voltage near 0V whereas photocathode layer 20 is typically specified at a voltage between −200 and −2000V during operation. This convention minimizes system level complexities that would result from isolating and floating image sensor electronics at an elevated voltage. The near 0V bias voltage on electron sensitive surface 80 may be sourced either through the silicon based image sensor bond pads 50 or via an external low impedance electrical pad 203 (see FIG. 3) which is in turn connected to metallization layer 213 (see FIG. 3), which bridges between pad 203 and the electron sensitive surface 80. Once again, metallizations of electrical pad 203 and metallization layer 213 are understood to be present on the cross section of FIG. 1A but are either not present due to the position of the cross section or are unresolved due to the scale of the drawing. One end of the electrical connection to the electron sensitive surface 80, in this embodiment formed by the metallization layer 213, is within the vacuum gap 70, and another end of the electrical connection to the electron sensitive surface 80, in various embodiments formed by the pad 50 or the pad 203, is outside the vacuum gap 80 and vacuum envelope for external connection.

Some imaging silicon based image sensors are incompatible with the low impedance contacting approach, specifically, metal pad read out integrated circuits which require electrically isolated metal pads to sense the position of incoming electrons. However, other silicon based image sensors such as back-side illuminated electron bombarded active pixel sensors (EBAPS®), CCDs and CMOS imagers designed to record the time of arrival of photoelectron strikes which are terminated at the vacuum surface by a heavily doped conductive layer, may benefit from the presence of the low impedance contact path. One embodiment of the disclosed sensor makes use of a silicon based image sensor anode assembly 60 that is (or at least includes) a CMOS back side thinned electron bombarded active pixel sensor which further incorporates a heavily doped vacuum surface termination over its electron sensitive region, e.g., electron sensitive surface 80. The low impedance path holds particular importance for sensors that require short duration high voltage switching or gating. During rapid high voltage bias swings, significant currents flow to the surface of both the photocathode layer 20 and the electron sensitive surface 80 of the anode assembly 60 (opposing the surface of photocathode layer 20 of the photocathode window assembly 11), where high voltage is present. Forcing these current surges through the image sensor bond pads 50 can potentially interfere with sensitive image sensor operations.

Raised feature 90 is a raised portion of the vacuum facing surface of the photocathode window assembly 11. The raised portion may be fabricated via a molding process when the window material is heated to near its softening point. In the case of one embodiment, the raised feature 90 may be molded in at the time of the photocathode-to-glass bonding step. Graphite molds may be used to shape 7056 glass windows. The purpose of the raised feature 90 is to control the height of the vacuum gap 70 between photocathode layer 20 and the electron sensitive surface 80 of the anode assembly 60, in the silicon based image sensor. Raised feature 90 could be implemented as, for example, a raised border, a series of raised portions, opposing raised portions on two sides, or four sides, or at corners of the vacuum facing surface of the photocathode window assembly 11, or combinations thereof in various embodiments. Raised feature 90 is on one face of the photocathode window assembly 11, the face that has the photocathode layer 20. Raised feature 90 is integral with, and formed with one or more of the same materials as, that face of the photocathode window assembly 11 in one embodiment. Further arrangements and implementations for the raised feature 90 are readily devised such that the raised feature(s) 90 results in establishment of the vacuum gap 70 of the assembled image sensor.

During fabrication, the photocathode window assembly 11 and the anode assembly 60 are typically processed individually. The sensor components are joined under ultra-high vacuum conditions after photocathode window assembly 11 processing and anode assembly 60 processing steps have been completed. The joining process typically occurs at or near room temperature. The photocathode window assembly 11 and anode assembly 60 are precisely aligned and compressed against each other so as to form a vacuum tight compression seal via malleable vacuum seal 40. As the seal material is compressed, raised feature 90 of the photocathode window assembly 11 and the surface of the anode assembly 60 in the silicon based image sensor approach one another. When raised feature 90 contacts the silicon surface, the compression of malleable vacuum seal 40 ceases and a vacuum gap 70 of uniform thickness is achieved. The gap height of the vacuum gap 70 that separates the photocathode layer 20 and the electron sensitive surface 80 is established and thus defined by the raised feature 90. Malleable vacuum seal 40 may consist of but is not limited to indium, lead, tin, gold, copper, aluminum or alloys of the previously listed materials. In one embodiment, malleable vacuum seal 40 is primarily of indium.

Figure 2:
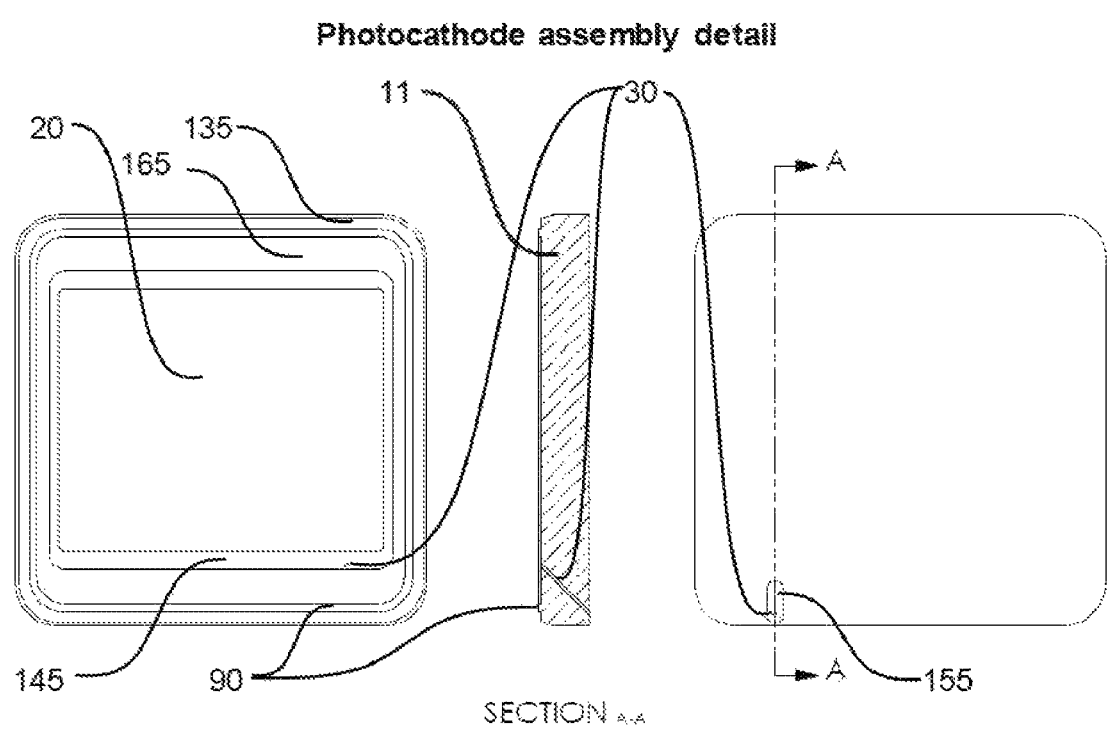
FIG. 2 depicts a detail of a photocathode assembly suitable for use in an embodiment of the compact proximity focused image sensor of FIG. 1A.

FIG. 2 depicts a detail of a photocathode window assembly 11 suitable for use in an embodiment of the compact proximity focused image sensor of FIG. 1A. The leftmost view is the "interior" elevation view, the rightmost view is the "exterior" or outer elevation view, and the middle view is a cross section along line A-A in the rightmost view. Highlighted in the left most section of FIG. 2 are the relative locations of the various features included on the vacuum exposed surface of the photocathode window assembly 11. In one embodiment shown in FIG. 2, the photocathode layer 20 covers a rectangular area that is slightly larger than the active area of the electron sensitive surface 80 of the silicon anode assembly 60. The larger dimensions of the active photocathode accommodate any misalignment errors that may occur during the vacuum sealing process of the compact sensor. This arrangement insures that the full range of addressable pixels in the finished sensor will achieve light sensitivity.

Layer 145 is a thin metallization layer. Layer 145 provides a reliable electrically connection between the photocathode layer 20 and the vacuum leak tight conductive path 30 that transits the photocathode window assembly 11. This layer 145 is typically deposited via a vacuum sputter physical vapor deposition process (PVD) so as to conformally coat any steps that may occur at the edge of the conductive path 30 or the photocathode layer 20 edge. Layer 145 may be of a wide variety of metals including but not limited to chromium, aluminum, silver, nickel, titanium, tantalum, ruthenium, molybdenum, hafnium, vanadium, manganese, cobalt, iron, zirconium, niobium and copper. The metal layers may be alloyed or stacked in order to achieve multiple goals. As a secondary goal, layer 145 may be used as a thin film getter. Metals and alloys suitable for use as getters in vacuum devices are discussed in U.S. Pat. No. 6,100,627. However, the effectiveness and activation characteristics of thin film getters is highly dependent on the particular tool set and conditions used in the deposition of the film thus this aspect of metallization layer 145 will likely require individual optimization of the deposition conditions, metal layer composition, and/or compositions and thicknesses of a multiple metal layer stack. A typical thickness for metallization layer 145 is 200 to 500 nm.

Surrounding metallization for 145 is an area, specifically part of the surface, of the photocathode assembly labeled as voltage drop region 165. When assembled in a finished sensor, voltage drop region 165 is physically separated from the silicon anode assembly 60 by vacuum gap 70. Voltage drop region 165 extends from the metallization layer 145 which is specified at the photocathode potential voltage to the point where raised feature 90 contacts the anode assembly 60 thereby specifying the contact point to be at the anode assembly voltage potential or in the case where raised feature 90 is omitted (see FIG. 5), voltage drop region 165 extends to the edge of the malleable vacuum seal 40, once again which is at the specified voltage of the anode assembly 60. As a consequence of this definition of voltage drop region 165, this area bridges the specified photocathode potential and the specified anode potential. As such a voltage drop occurs across voltage drop region 165. Voltage drop region 165 may be maintained as clean glass. Corning code 7056 glass is demonstrated to be a suitable insulator over which the voltage drop from the photocathode potential to the anode potential may be established with minimal surface leakage. Alternately, voltage drop region 165 may be coated with a high resistivity coating such as a Chromium oxide or a high resistance mixed metal oxide coating. Coatings with a resistance on the order of $10^{12}$ to $10^{15}$ Ohms per square are preferred although lower resistance coatings may be used at the price of increased high voltage leakage. Coatings of this type are known to those skilled in the art of vacuum tube manufacture and may provide an advantage by specifying a predictable voltage potential at all points across voltage drop region 165. The presence of a high resistance coating across voltage drop region 165 will introduce a leakage current to flow between the photocathode potential and the anode potential. The presence of the coating may reduce the probability of arcing across voltage drop region 165.

Metallization pad 155 on the outer surface of the photocathode window assembly 11 provides a reliable connection between conductive path 30 and electrical connections to external systems like a high voltage power supply (HVPS). A typical metallization layer may consist of but is not limited to a chrome or titanium adhesion layer on the order of 25 nm thick, a diffusion barrier of ~100 nm of platinum followed by a surface layer of ~50 nm of gold. A low temperature solder such as an indium tin eutectic can be used to attach an electrical lead to pad 155.

Also shown in the left most drawing of FIG. 2 is surface 135. Surface 135 is shown as the bare window surface that falls between surface raised feature 90 and the edge of the window assembly in this "plan" view. In one embodiment this is a bare Corning Code 7056 glass surface. The cleanliness of this surface is critical to achieving reliable vacuum sealing of the sensor. Internal testing has shown that a bond of sufficient quality and strength is achieved when this surface is subjected to an oxygen plasma cleaning process and compression sealed into clean high purity indium. Whereas feasibility was demonstrated using this procedure, the disclosed geometry is not limited to this specific process and interface. In fact, care must be taken when exposing this surface to the oxygen plasma. GaAs photocathodes may be damaged by such a plasma and therefore must be shielded from exposure to the plasma. Alternate approaches to achieving high vacuum seal bond strength may be developed without violating the teaching of this disclosure. An alternative approach includes the metallization of surface 135 with a metallization layer consisting of but is not limited to a chromium or titanium adhesion layer on the order of 25 nm thick, a diffusion barrier of ~100 nm of platinum followed by a surface layer of ~50 nm of gold.

After compression sealing to a malleable indium layer a laser anneal may be applied through the transparent window material in order to generate interdiffusion of the indium layer and the gold surface layer. A wide variety of options are available to those skilled in the art of generating high strength surface bonds. Any bonding approach that leads to a sufficient bond strength with the malleable vacuum seal 40 (FIG. 1) is acceptable and thereby covered by this disclosure. Photocathode window assembly 11 may range in overall thickness from on the order of 0.5 mm to more than 5 mm. In the depicted embodiment, photocathode window assembly is about 2 mm thick and composed of Corning Code 7056 glass.

In one embodiment, conductive path 30 consists of a Kovar™ wire, typically 0.010″ to 0.020″ in diameter, hermetically sealed to the 7056 glass window material. The location of the wire and the angle with which the wire transits the photocathode assembly are chosen both for convenience and to minimize the impact of the wire on system level veiling glare performance. Typical night vision systems make use lenses with low F numbers. The wire for this implementation of conductive path 30 is angled away from the active area of the photocathode layer 20 in order to minimize the chance that the incoming light will illuminate the wire. Similarly, the wire is located near the corner of the photocathode layer 20. Since most lens systems show a radially symmetric roll-off in relative illumination, the corner positioning of the conductive path 30 minimizes the chance that it will be illuminated and therefore contribute to system level image artifacts.

Figure 3:
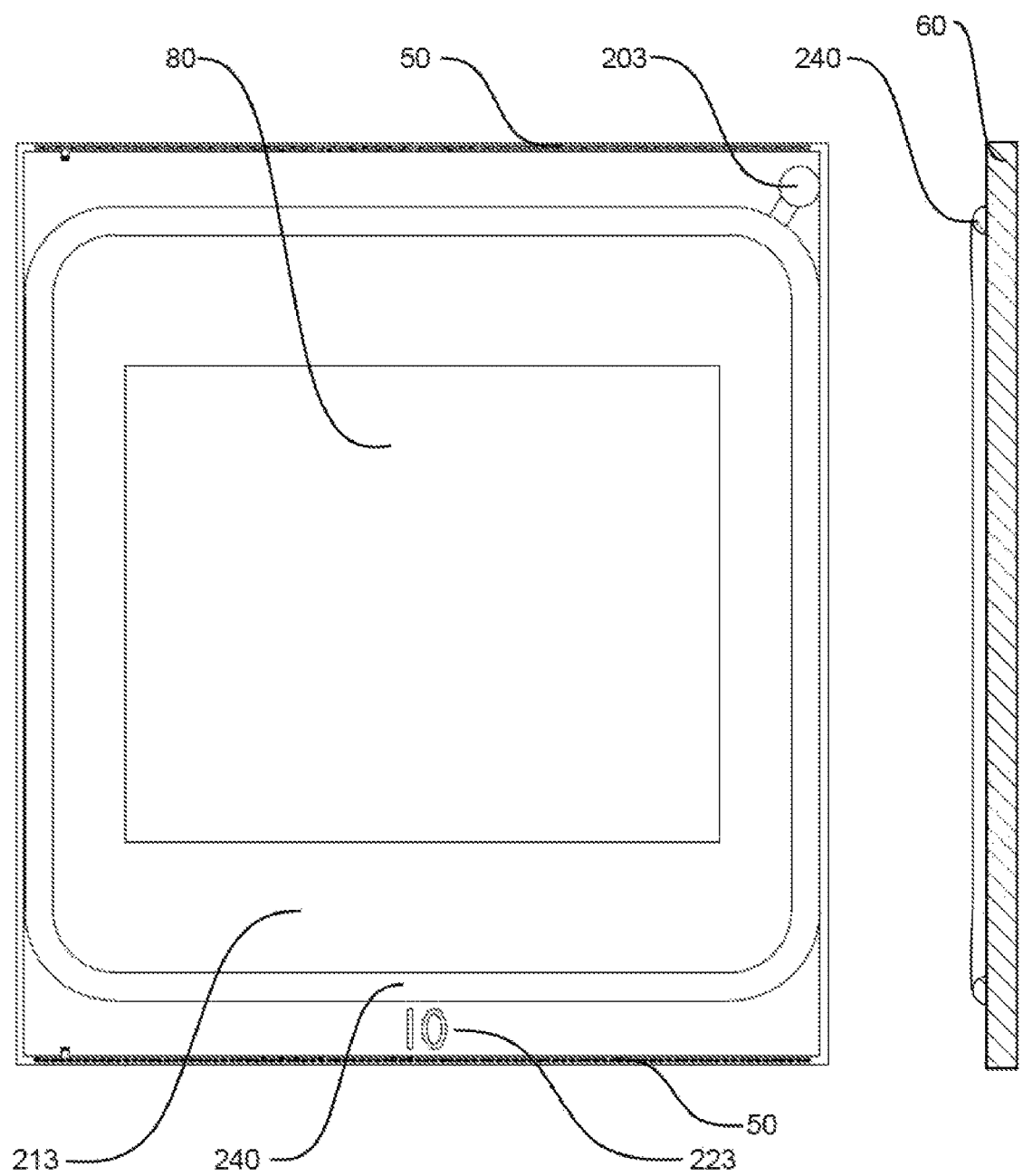
FIG. 3 depicts a detail of an electron sensitive, silicon, image sensor assembly detail, for the anode assembly, suitable for use in an embodiment of the compact proximity focused image sensor of FIG. 1A.

FIG. 3 depicts a detail of an electron sensitive, silicon, image sensor assembly, for the anode assembly 60, suitable for use in an embodiment of the compact proximity focused image sensor of FIG. 1A. The left illustration is an interior elevation and the right illustration is a side view. The electron sensitive surface 80 of the anode assembly 60 is typically sized to be slightly smaller than that of the area of the photocathode layer 20. Before the vacuum compression seal is formed, the photocathode window assembly 11 and the anode assembly 60 are aligned such that in a plan view, the electron sensitive surface 80 is fully overlaid by the active area of the photocathode layer 20. The electron sensitive surface 80 of the anode assembly 60 is surrounded by, and electrically contacted by, metallization layer 213. Metallization layer 213 serves to provide a low impedance electrical contact both to the electron sensitive active area of the anode assembly 60 and contact pad metallization 203. A pad metallization layer consisting of, but is not limited to, a chromium or titanium adhesion layer on the order of 25 nm thick, a diffusion barrier of about 100 nm of platinum followed by a surface layer of about 50 nm of gold is suitable as a wetting layer for electrical pad 203. Metallization layer 213 runs below sealing layer 240 to bridge electron sensitive surface 80 and contact the pad metallization of electrical pad 203. Sealing layer 240 is formed from the malleable metal bonding material. In one embodiment, sealing layer 240 is formed by indium. The indium may be pre-wet to anode assembly 60 by pre depositing a metallization pad on the surface of metallization layer 213. A pad metallization layer consisting of but is not limited to a chromium or titanium adhesion layer on the order of 25 nm thick, a diffusion barrier of about 100 nm of platinum followed by a surface layer of about 50 nm of gold is suitable as a wetting layer for sealing layer 240. Metallization layer 213 should be terminated with a layer that is not readily wet with molten indium such as chromium. In the case where low temperature malleable sealing materials are used to form sealing layer 240, the material may be wet to the surface via a low temperature vacuum thermal cycle. Typical CMOS based silicon imaging anode assemblies have a maximum thermal limit that falls between 400 and 500 degrees C. In the case of the use of malleable metal sealing layers 240 other than indium, or other low melting point alloys such as lead-tin solders, direct metal deposition techniques including plating may be used to form sealing layer 240. Particularly in the case of plating, an extended vacuum bake may be required to sufficiently outgas the metal layer.

Pad 50 indicates the location of one of the bond pads by which the silicon based imager is powered, control signals sent, and through which all image information is transmitted to external camera electronics or other data recording or display systems. In one embodiment there are on the order of 140 bond pads. In order to increase the ease with which wirebonds can be made to the bond pads, the pads may be pre-bumped with gold balls before the anode assembly 60 is vacuum sealed. After vacuum sealing, the thermal budget of the processed photocathode assembly may limit the temperature at which the wirebond can be performed thereby impacting wirebond reliability. The presence of gold bumps on the pads 50 lowers the temperature at which reliable wirebonds can be formed vis-à-vis standard, un-bumped, aluminum wirebond pads. Identification 223 is an identification number (or other identifier) printed on the compact proximity focused image sensor. While not necessary, the presence of this feature aids in sensor tracking.

Figure 4:
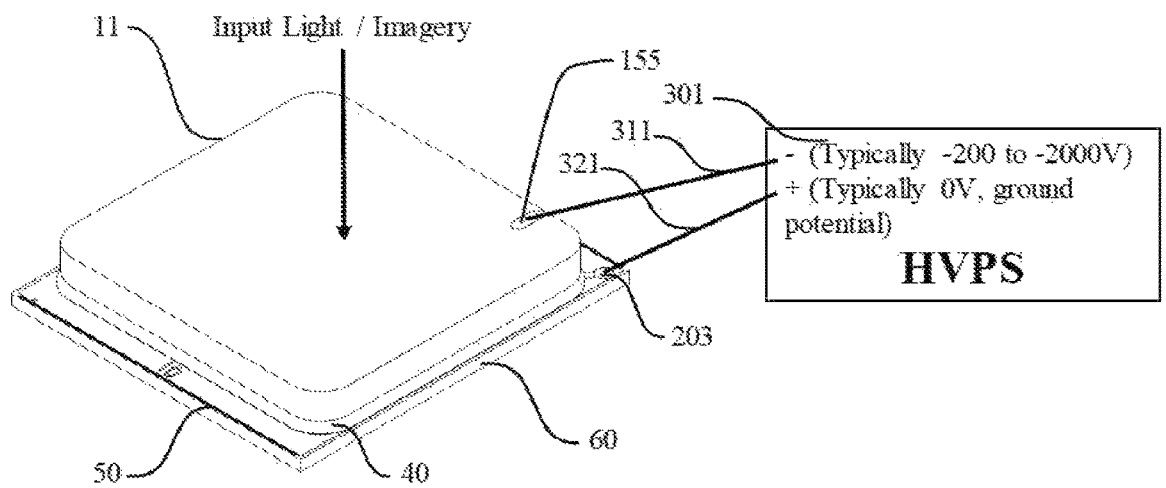
FIG. 4 depicts an illuminated compact proximity focused vacuum image sensor biased by a high voltage power supply (HVPS), typical of how the sensor is operated in a night vision system.

FIG. 4 depicts an illuminated novel geometry compact proximity focused vacuum image sensor biased by a high voltage power supply 301, typical of how the sensor is operated in a night vision system. The high voltage power supply 301 provides a voltage bias of the photocathode layer 20 relative to the electron sensitive surface 80 (see FIG. 1A). Optical imagery, typically sourced via an objective lens (not shown) is focused through the photocathode window assembly 11 onto the photocathode focal plane. The photocathode translates the optical image into a spatially and temporally correlated stream of free photoelectrons at the vacuum surface of the photocathode. The high voltage bias, as applied by the high voltage power supply 301, accelerates the photoelectrons across the vacuum gap and into the electron sensitive area of the anode assembly 60 while retaining a high level of fidelity in terms of the original spatial and temporal correlation of the photoelectron output of the photocathode. In the case of EBAPS sensors and EBCCD sensors, the photoelectrons that enter the silicon based image sensor will generate impact ionization gain, thereby creating electron-hole pair clouds within the silicon of the electron sensitive image sensor. The charge associated with these electron-hole pair clouds will be separated by design within the sensor such that the position and timing information associated with the photoelectron arrival may be sensed and transmitted to receiving electronics via wirebond pads 50. In a properly designed system, the electron bombarded gain will exceed the temporal noise floor of the electron sensitive silicon based image sensor thereby allowing reliable detection of single photoelectrons. The configuration shown is suitable for use with silicon based electron sensitive image sensor anode assemblies 60 that make use of a continuous conductive electron sensitive active area as may be present in backside thinned active pixel sensors and backside thinned CCD image sensors.

In the case of an electron sensitive readout integrated circuit (ROIC) where isolated conductive pads sense the presence of incoming photoelectrons, the positive contact lead 321 from the high voltage power supply 301 should be redirected from pad 203 to an appropriate wirebond pad 50. However, for the embodiment depicted in FIG. 4, the negative lead 311 of the high voltage power supply 301 is connected to pad 155 while the positive lead 321 of the high voltage power supply 301 is connected to pad 203. Pad connections may be made using a low melting point solder alloy such as an indium/tin eutectic. Care must be taken when making these connections not to overheat the malleable vacuum seal 40. When indium is used as the malleable metal seal material, its 156° C. melting point specifies the temperature at which seal failure will rapidly occur. Although not drawn, leads 311 and 321 may be essentially collocated via the use of high voltage rated coaxial shielded cables. The use of shielded coax is particularly useful to minimize radiated emissions particularly when using a switching or gated high voltage power supply. Minimizing radiated emissions from the high voltage power supply minimizes the chance that power supply switching will introduce image artifacts into the data stream produced by the electron sensitive silicon based image sensor, or more specifically by the anode assembly 60.

Figure 5:
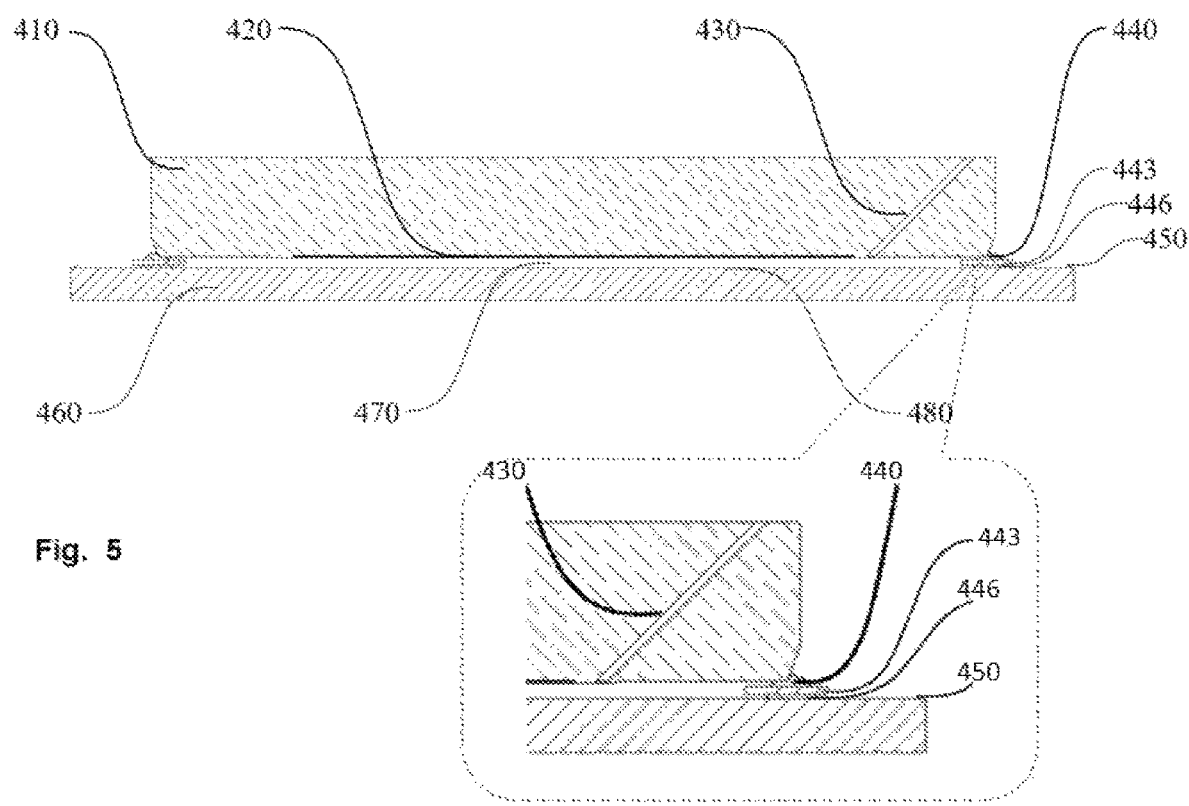
FIG. 5 depicts a further embodiment of a compact proximity focused vacuum image sensor.

FIG. 5 depicts a further embodiment of a compact proximity focused vacuum image sensor. Two additional layers are introduced into the seal stack, which joins the photocathode window assembly 410 to the anode assembly 460. The photocathode window assembly 410 is directly joined to the silicon based image sensor anode assembly 460, by means of a stack of sealing layers consisting of or including (in various embodiments) layer 440 a malleable metal layer, layer 443 a structural layer of a material typically chosen to have a thermal coefficient of expansion falling between that of the photocathode window assembly 410 and that of the anode assembly 460, and layer 446 a braze or solder material. The combined photocathode window assembly 410, the seal stack, layers 440, 443, 446, and the anode assembly 460 thereby forms the image sensor vacuum envelope that encloses the vacuum gap 470. The photocathode layer 420 and the electron sensitive surface 480 of the electron sensitive silicon based image sensor fall within the vacuum envelope. The image sensor electrical connections, in the form of wirebond pads 450, access all image sensor electrical functionality required to power, control, monitor and read data out from the image sensor. The location of the image sensor wirebond pads 450 falls outside the vacuum envelope formed between or by the photocathode window assembly 410, the silicon based electron sensitive image sensor anode assembly 460 and the seal stack composed of layers 440, 443, 446. The routing of the image sensor electrical connections from within the electron sensitive silicon based image sensor to a location outside of the vacuum envelope is a beneficial advantage of this sensor over prior art sensors in that it eliminates the need and thereby the cost to create a sensor component containing multiple vacuum electrical feed-through elements.

The photocathode window assembly 410 is formed from a material that is transparent to light in the wavelengths of interest. Typical choices for the window material include but are not limited to glass, quartz, sapphire and certain transparent, primarily ionic salts. In one embodiment, the photocathode window assembly 410 is composed primarily of Corning Code 7056 glass. In operation, light, typically is focused, from the top of FIG. 5, through photocathode window assembly 410 onto photocathode layer 420 via an objective lens (not shown). The photocathode layer 420 may include but is not limited to a multialkali antimonide based photocathodes a III-V semiconductor based photocathode, a group IV photocathode or a perovskite photocathode. In one embodiment, photocathode layer 420 is composed of a glass-bonded, thermally assisted negative affinity photocathode (TANEA), transmission mode photocathode as described in US Patent Application Publication US2019/0080875. The full publication of US2019/0080875 is hereby incorporated by reference. The TANEA photocathode used with a GaAs optical absorber layer is suitable for use in the disclosed compact sensor geometry for applications requiring digital night vision imagery. Selected wavelengths of the incoming light are absorbed in photocathode layer 420 resulting in energetic electrons which have a finite probability of being emitted into the vacuum gap 470 that separates the photocathode layer 420 from the silicon based anode assembly 460. In order to support photocathode electron emission and transit of the photoelectrons across the vacuum gap 470, a high bias voltage is applied between photocathode layer 420 and anode assembly 460. The high voltage bias reaches photocathode layer 420 via a conductive path 430 and a metallization layer similar to that depicted in 145 (FIG. 2), the notable difference in the photocathode assembly of FIG. 5 is that raised feature 90 shown has been eliminated leaving a planar photocathode surface extending to the edge of the photocathode window assembly 410. The elimination of raised feature 90 significantly simplifies the manufacture of photocathode window assembly 410 of the embodiment in FIG. 5 versus the photocathode window assembly 11 of the embodiment in FIG. 1A. The functionality of raised feature 90, to accurately specify the vacuum gap 70 (in FIG. 1A), now vacuum gap 470 (in FIG. 5), is replaced by the seal stack thickness of the combined layers 440, 443, 446. That is, in the embodiment of an image sensor shown in FIG. 5, the seal stack thickness, for example thickness of the malleable metal seal, establishes and defines the gap height of the vacuum gap 470 that separates the photocathode layer 420 and the electron sensitive surface 480.

If the structural layer 443 closely approaches the coefficient of thermal expansion of the silicon based anode assembly 460, such as Invar, a step-braze material such as Au—Sn eutectic may be used to join layer 443 to anode assembly 460. The described material choices allow layers 443 and 446 to be pre-assembled to anode assembly 460 with precision tolerancing before vacuum processing. The melting point of Au—Sn eutectic of about 280° C. is often considered a solder material however, it functions similar to that of a step braze in that if layer 440 is chosen to be indium (melting point about 156° C.) processing temperatures can be chosen to insure that the accurately set stack height of layers 443, 446 are not degraded by a subsequent remelt.

A metallization analogous to layer 145 (see FIG. 2) is understood to be present in FIG. 5 but is not resolved at the scale of the drawing. The unresolved metallization layer analogous to layer 145 bridges the electrical connection between electrically conductive path 430 and photocathode layer 420. Consequently, the bias voltage applied to the conductive path 430 specifies the electrical potential of the photocathode layer 420. Conductive path 430 is a vacuum leak tight conductive path that bridges the vacuum surface of photocathode layer 420 of photocathode window assembly 410 to the external surface of the photocathode window assembly 410. In one embodiment, conductive path 430 is implemented with a Kovar™ wire sealed into the Corning Code 7056 glass window assembly. The wire, implementing conductive path 430, is finished flush to the vacuum surface of the photocathode window assembly 410 so as to minimize the chance of field emissions from the wire during sensor operation. Similarly, the point at which the conductive path 430 exits photocathode window assembly 410 is finished flush with the assembly surface so as to facilitate compact packaging of the sensor. On the external surface of photocathode window assembly 410 where conductive path 430 exits, a metallization pad analogous to 155 (see FIG. 2) may be applied to ease reliable connection to an external high voltage power supply lead. Once again, metallization pad 155 is understood to be present in FIG. 5 but is unresolved due to the scale of the drawing.

Additional features visible in FIG. 5 include the electron sensitive surface 480 of the silicon based image sensor. This electron sensitive surface 480 lies directly across vacuum gap 470 from photocathode layer 420. The intersection of the overlaid areas (in a plan view) of photocathode layer 420 and electron sensitive surface 480 of the silicon based image sensor specify the effective active area of one embodiment of the compact proximity focused image sensor.

The electron sensitive surface 480 of the silicon based image sensor is specified at a bias voltage above that of photocathode layer 420 in order to attract photoelectrons across vacuum gap 470. Typical vacuum gaps range from 0.0015" to 0.020", one embodiment targets gaps in the range of 0.004" and 0.007". Electron sensitive surface 480 is typically specified at a voltage near 0V whereas photocathode layer 420 is typically specified at a voltage between −200 and −2000V during operation. This convention minimizes system level complexities that would result from isolating and floating image sensor electronics at an elevated voltage. The near 0V bias voltage on electron sensitive surface 480 may be sourced either through the silicon based image sensor bond pads 450 or via an external low impedance electrical pad 203 (FIG. 3) which is in turn connected to metallization layer 213 (see FIG. 3), which bridges between pad 203 and the electron sensitive surface 80. Once again, metallization of electrical pad 203 and metallization layer 213 are understood to be present on a cross section of FIG. 5 but are either not visible in the drawing due to the position of the cross section or are unresolved due to the scale of the drawing.

Some imaging silicon based image sensors are incompatible with the low impedance contacting approach, specifically, metal pad read out integrated circuits which require electrically isolated metal pads to sense the position of incoming electrons. However, other silicon based image sensors such as back-side illuminated electron bombarded active pixel sensors (EBAPS), CCDs and CMOS imagers designed to record the time of arrival of photoelectron strikes which are terminated at the vacuum surface by a heavily doped conductive layer, may benefit from the presence of the low impedance contact path. One embodiment of the sensor makes use of a silicon based image sensor anode assembly 460 that has a CMOS back side thinned electron bombarded active pixel sensor which further incorporates a heavily doped vacuum surface termination over its electron sensitive region. The low impedance path holds particular importance for sensors that require short duration high voltage switching or gating. During rapid high voltage bias swings, significant currents flow to the surface of both the photocathode and the surface of the anode assembly opposing the surface of the photocathode assembly where high voltage is present. Forcing these current surges through the image sensor bond pads 450 can potentially interfere with sensitive image sensor operations.

During fabrication, the photocathode window assembly 410 and the anode assembly 460 are typically processed individually. The sensor components are joined under ultrahigh vacuum conditions after photocathode window assembly 410 processing and anode assembly 460 processing steps have been completed. The joining process typically occurs at or near room temperature. The photocathode window assembly 410 and anode assembly 460 are precisely aligned and compressed against each other so as to form a vacuum tight compression seal via malleable seal 440. As the seal material is compressed, the surfaces of the silicon based image sensor components approach one another. Control of seal force and time determine the degree of compression-induced flow of the malleable seal 440. Seal force is ceased when a vacuum gap 470 of uniform thickness is achieved. Malleable seal 440 may consist or be composed of but is not limited to indium, lead, tin, gold, copper, aluminum or alloys of the previously listed materials. In one embodiment, malleable seal 440 is primarily of indium.

Although in the detailed description of FIG. 5 above, layers 443 and 446 are described as being Invar and Au—Sn eutectic other material choices may be beneficial. Alternate options for layer 446 include but are not limited to lead-tin based solders and indium. Alternate options for layer 443 include Kovar, intermediate coefficient of expansion Co—Ni—Cr—Fe alloys or a tape-cast ceramic layer such as Kyocera A440 Alumina. The use of an intermediate coefficient of thermal expansion (CTE) (the term intermediate is to be understood to mean that the CTE of layer 443 falls between the CTE of photocathode window assembly 410 and that of anode assembly 460) coupled with the use of a malleable joining layer 446, allows the CTE mismatch between photocathode window assembly 410 and anode assembly 460 to be accommodated in a step-wise manner across the seal stack composed of layers 440, 443, 446. The use of an insulating layer as layer 443 allows the voltage drop between photocathode layer 420 and the silicon based image array anode assembly 460 to be engineered with a greater degree of control via the specification of the voltage potential applied to malleable sealing layer 440.

The present invention has been described in relation to particular examples reflective of preferred embodiments. The examples are meant to be illustrative rather than restrictive. Those skilled in the art of proximity focused image sensor manufacture will appreciate many different combinations suitable for inclusion in the practice of the present invention.

Specific variations of the described invention that are anticipated include but are not limited to:

Routing the silicon based sensor electrical connections to the surface of the sensor the sensor 610 opposite that of the electron sensitive surface. This may be achieved with the introduction of through silicon vias or by wrapping the electrical connections across the sides of the sensor.

Adding a dielectric layer to the surface of the silicon based electron sensitive image sensor assembly, e.g., to a surface of the anode assembly.

The use of multiple conductive traces through the photocathode window assembly.

The introduction of an electron collimator to control electron-backscatter image artifacts as described in U.S. Pat. No. 8,698,925.

Figure 6:
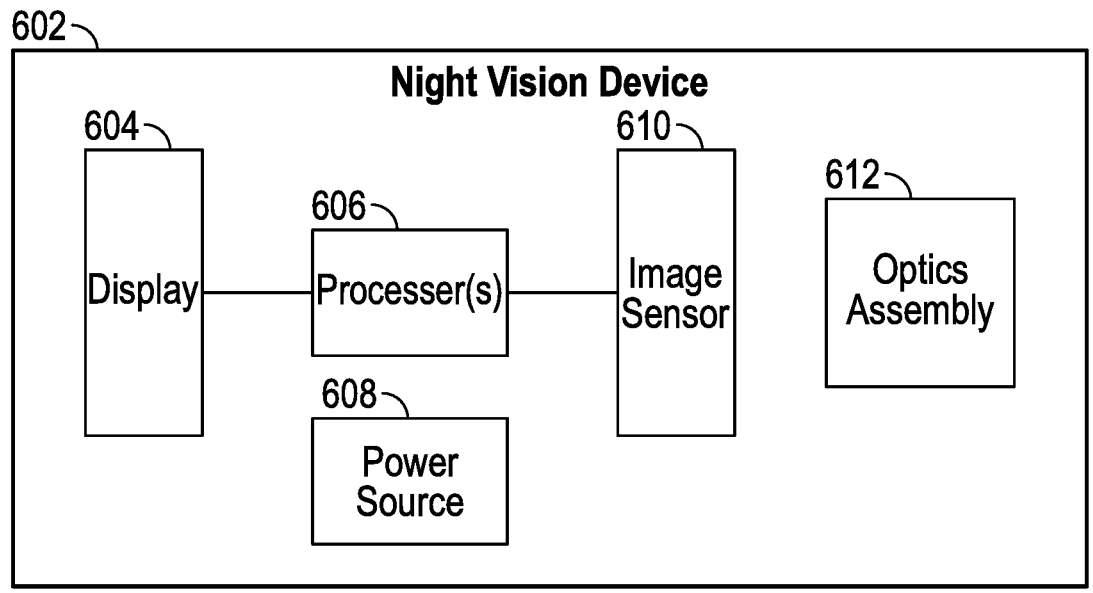
FIG. 6 depicts a night vision device that has an embodiment of the compact proximity focused vacuum image sensor of FIG. 1A.

FIG. 6 depicts a night vision device 602 that has an embodiment of the compact proximity focused vacuum image sensor of FIG. 1A. A power source 608, which could include batteries, provides electrical power to the various components. Light (photons) from a scene external to the night vision device 602 are focused by an optics assembly 612 onto the image sensor 610. The optics assembly 612 could include mirrors, lenses, or combination readily devised to suit device requirements. One or more processors 606 read input image data from the image sensor 610, process the data and send output image data to the display 604, also called a viewscreen, for viewing by a user.

Figure 7:
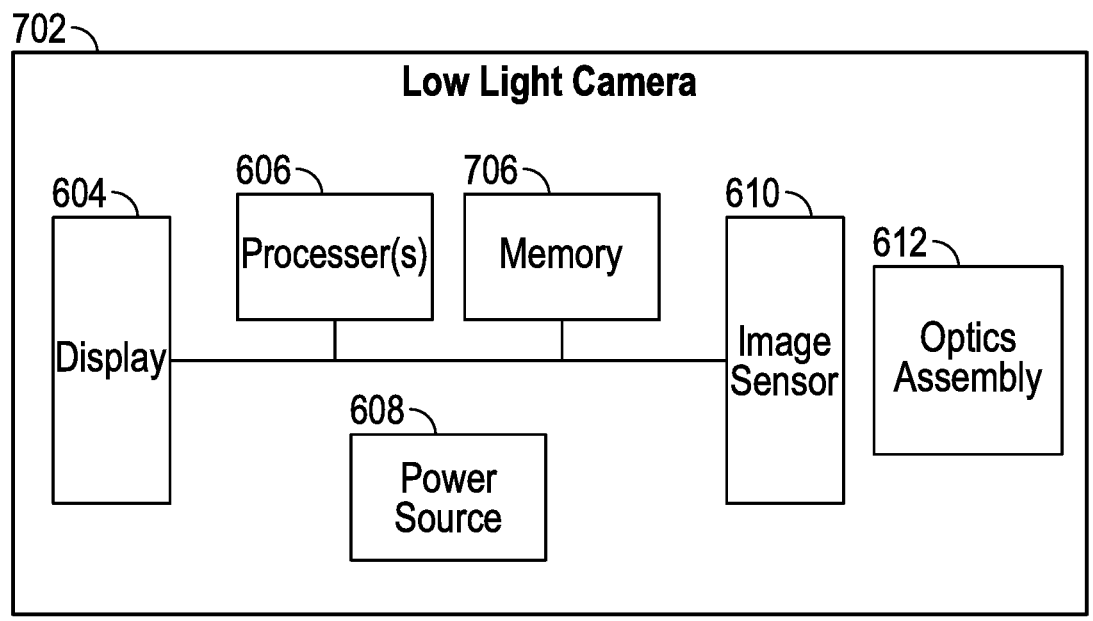
FIG. 7 depicts a lowlight camera that has an embodiment of the compact proximity focused vacuum image sensor of FIG. 1A.

FIG. 7 depicts a low light camera 702 that has an embodiment of the compact proximity focused vacuum image sensor of FIG. 1A. There are some similarities the low light camera shares with the night vision device 602. A power source 608, which could include batteries, provides electrical power to the various components. Light (photons) from a scene external to the low light camera 702 are focused by an optics assembly 612 onto the image sensor 610. The optics assembly 612 could include mirrors, lenses, or combination readily devised to suit device requirements. One or more processors 606 read input image data from the image sensor 610, process the data and send output image data to the memory 606 (e.g., storage memory, which may be removable media) for recording as a digital image or digital photograph, and to the display 604, for viewing by a user. In a variation, the display 604 is omitted and the low light camera is instead equipped with an aiming device, such as a pair of rectangular outline frames attached to the outside of a case, for visual alignment with a scene. In a further variation, the optics assembly 612 is omitted, and the device is implemented as a camera body, for attachment to an optics assembly 612, which may be replaceable, for example exchangeable lenses for camera equipment. In a further variation, the optics assembly 612 and the display 604 are omitted, and the device is implemented as an imaging assembly for attachment to telescope optics for astronomy, with an external display or connection to a computer for more advanced image processing.

The following statements are of various embodiments, and include apparatuses or devices, and methods of making apparatuses or devices.

Statement 1. A vacuum proximity focused image sensor comprising:
a photocathode window assembly having a face with one or more raised features and a photocathode layer;
an anode assembly comprising a silicon substrate having an electron sensitive surface;
a malleable metal seal bonding the photocathode window assembly and the silicon substrate to each other, forming a vacuum gap that separates the photocathode layer of the photocathode window assembly and the electron sensitive surface of the silicon substrate of the anode assembly by a gap height defined by the one or more raised features of the face of the photocathode window assembly;
a first electrical connection to the photocathode layer, for a voltage bias; and
a second electrical connection to the electron sensitive surface, for the voltage bias.

Statement 2. The vacuum proximity focused image sensor of statement 1, wherein the one or more raised features are integral with and formed of one or more materials of the face of the photocathode window assembly.

Statement 3. The vacuum proximity focused image sensor of statement 1, wherein the malleable metal seal is formed such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 4. The vacuum proximity focused image sensor of statement 1, wherein the first electrical connection to the photocathode layer comprises an electrically conductive path that transits the photocathode window assembly to specify an electrical potential of the photocathode layer.

Statement 5. The vacuum proximity focused image sensor of statement 1, wherein the first electrical connection comprises a Kovar™ wire.

Statement 6. The vacuum proximity focused image sensor of statement 1, wherein the malleable metal seal comprises indium.

Statement 7. The vacuum proximity focused image sensor of statement 1, wherein the silicon substrate having the electron sensitive surface comprises a backside thinned CMOS active pixel sensor.

Statement 8. The vacuum proximity focused image sensor of statement 1, wherein the silicon substrate having the electron sensitive surface comprises a backside thinned CCD image sensor.

Statement 9. The vacuum proximity focused image sensor of statement 1, wherein the silicon substrate having the electron sensitive surface comprises a CMOS imager arranged to record time of arrival of photoelectron strikes.

Statement 10. The vacuum proximity focused image sensor of statement 1, wherein the photocathode layer comprises a glass-bonded, thermally assisted negative affinity photocathode (TANEA), transmission mode photocathode.

Statement 11. The vacuum proximity focused image sensor of statement 1, wherein the photocathode layer comprises a gallium arsenide (GaAs) absorber layer.

Statement 12. A vacuum proximity focused image sensor comprising:
a photocathode window assembly having a photocathode layer;
an anode assembly comprising a silicon substrate having an electron sensitive surface;
a malleable metal seal bonding the photocathode window assembly and the silicon substrate to each other, forming a vacuum gap that separates the photocathode layer of the photocathode window assembly and the electron sensitive surface of the silicon substrate of the anode assembly, the vacuum gap having a gap height defined by a thickness of the malleable metal seal;
a first electrical connection to the photocathode layer, for a voltage bias; and
a second electrical connection to the electron sensitive surface, for the voltage bias.

Statement 13. The vacuum proximity focused image sensor of statement 12, wherein the photocathode window assembly having the photocathode layer comprises a planar photocathode surface extending to an edge of the photocathode window assembly; and the thickness of the malleable metal seal specifies the vacuum gap with precision tolerancing.

Statement 14. The vacuum proximity focused image sensor of statement 12, wherein the malleable metal seal is formed such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 15. The vacuum proximity focused image sensor of statement 12, wherein the first electrical connection to the photocathode layer comprises an electrically conductive path that transits the photocathode window assembly to specify an electrical potential of the photocathode layer.

Statement 16. The vacuum proximity focused image sensor of statement 12, wherein the first electrical connection comprises a Kovar™ wire.

Statement 17. The vacuum proximity focused image sensor of statement 12, wherein the malleable metal seal comprises indium.

Statement 18. The vacuum proximity focused image sensor of statement 12, wherein the silicon substrate having the electron sensitive surface comprises a backside thinned CMOS active pixel sensor, a backside thinned CCD image sensor, or a CMOS imager arranged to record time of arrival of photoelectron strikes.

Statement 19. The vacuum proximity focused image sensor of statement 12, wherein the photocathode layer comprises a glass-bonded, thermally assisted negative affinity photocathode (TANEA), transmission mode photocathode or a gallium arsenide (GaAs) absorber layer.

Statement 20. An image sensor comprising:
a photocathode window assembly having a photocathode layer;
an anode assembly comprising a silicon substrate having an electron sensitive surface;
a malleable metal seal bonding the photocathode window assembly and the silicon substrate to each other, forming a vacuum gap that separates the photocathode layer of the photocathode window assembly and the electron sensitive surface of the silicon substrate of the anode assembly;
a first electrical connection to the photocathode layer; and
a second electrical connection to the electron sensitive surface, wherein the first electrical connection and the second electrical connection are for voltage bias of the photocathode layer and the electron sensitive surface.

Statement 21. The image sensor of statement 20, wherein:
the photocathode window assembly having the photocathode layer comprises a planar photocathode surface extending to an edge of the photocathode window assembly; and
the thickness of the malleable metal seal specifies the vacuum gap with precision tolerancing.

Statement 22. The image sensor of statement 20, further comprising:
a face of the photocathode window assembly having one or more raised features that define a gap height of the vacuum gap.

Statement 23. The image sensor of statement 20, further comprising:
one or more raised features on a face of the photocathode window assembly, defining a gap height of the vacuum gap, wherein the one or more raised features are integral with and formed of one or more materials of the face of the photocathode window assembly.

Statement 24. The image sensor of statement 20, wherein the malleable metal seal is formed such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 25. The image sensor of statement 20, wherein the first electrical connection to the photocathode layer comprises an electrically conductive path that transits the photocathode window assembly to specify an electrical potential of the photocathode layer.

Statement 26. The image sensor of statement 20, wherein the first electrical connection comprises a Kovar™ wire.

Statement 27. The image sensor of statement 20, wherein the malleable metal seal comprises indium.

Statement 28. The image sensor of statement 20, wherein the silicon substrate having the electron sensitive surface comprises a backside thinned CMOS active pixel sensor, a backside thinned CCD image sensor, or a CMOS imager arranged to record time of arrival of photoelectron strikes.

Statement 29. The image sensor of statement 20, wherein the photocathode layer comprises a glass-bonded, thermally assisted negative affinity photocathode (TANEA), transmission mode photocathode or a gallium arsenide (GaAs) absorber layer.

Statement 30. A night vision device, comprising:
a viewscreen;
one or more processors; and
an image sensor, having:
a photocathode window assembly having a photocathode layer;
an anode assembly comprising a silicon substrate having an electron sensitive surface;
a malleable metal seal bonding the photocathode window assembly and the silicon substrate to each other, forming a vacuum gap that separates the photocathode layer of the photocathode window assembly and the electron sensitive surface of the silicon substrate of the anode assembly;
a first electrical connection to the photocathode layer; and
a second electrical connection to the electron sensitive surface, wherein the first electrical connection and the second electrical connection are for voltage bias of the photocathode layer and the electron sensitive surface.

Statement 31. The night vision device of statement 30, wherein:
the photocathode window assembly having the photocathode layer comprises a planar photocathode surface extending to an edge of the photocathode window assembly; and
the thickness of the malleable metal seal specifies the vacuum gap with precision tolerancing.

Statement 32. The night vision device of statement 30, further comprising:
a face of the photocathode window assembly having one or more raised features that define a gap height of the vacuum gap.

Statement 33. The night vision device of statement 30, further comprising:
one or more raised features on a face of the photocathode window assembly, defining a gap height of the vacuum gap, wherein the one or more raised features are integral with and formed of one or more materials of the face of the photocathode window assembly.

Statement 34. The night vision device of statement 30, wherein the malleable metal seal is formed such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 35. The night vision device of statement 30, wherein the first electrical connection to the photocathode layer comprises an electrically conductive path that transits the photocathode window assembly to specify an electrical potential of the photocathode layer.

Statement 36. The night vision device of statement 30, wherein the first electrical connection comprises a Kovar™ wire.

Statement 37. The night vision device of statement 30, wherein the malleable metal seal comprises indium.

Statement 38. The night vision device of statement 30, wherein the silicon substrate having the electron sensitive surface comprises a backside thinned CMOS active pixel sensor, a backside thinned CCD image sensor, or a CMOS imager arranged to record time of arrival of photoelectron strikes.

Statement 39. The night vision device of statement 30, wherein the photocathode layer comprises a glass-bonded, thermally assisted negative affinity photocathode (TANEA), transmission mode photocathode or a gallium arsenide (GaAs) absorber layer.

Statement 40. A method of making a vacuum proximity focused image sensor, comprising:
forming a photocathode window assembly having a face with one or more raised features and a photocathode layer;
forming an anode assembly comprising a silicon substrate having an electron sensitive surface;
bonding the photocathode window assembly and the silicon substrate to each other with a malleable metal seal;
forming a vacuum gap that separates the photocathode layer of the photocathode window assembly and the electron sensitive surface of the silicon substrate of the anode assembly by a gap height defined by the one or more raised features of the face of the photocathode window assembly;
forming a first electrical connection to the photocathode layer, for a voltage bias; and
forming a second electrical connection to the electron sensitive surface, for the voltage bias.

Statement 41. The method of statement 40, wherein the forming the photocathode window assembly comprises forming the one or more raised features integral with and of one or more materials of the face of the photocathode window assembly.

Statement 42. The method of statement 40, further comprising:
forming the malleable metal seal such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 43. The method of statement 40, wherein the forming the first electrical connection to the photocathode layer comprises forming an electrically conductive path that transits the photocathode window assembly to specify an electrical potential of the photocathode layer.

Statement 45. The method of statement 40, wherein the forming the first electrical connection comprises forming the first electrical connection using a Kovar™ wire.

Statement 46. The method of statement 40, further comprising:
forming the malleable metal seal, comprising indium.

Statement 47. The method of statement 40, further comprising:
forming the silicon substrate having the electron sensitive surface as a backside thinned CMOS active pixel sensor.

Statement 48. The method of statement 40, further comprising:
forming the silicon substrate having the electron sensitive surface as a backside thinned CCD image sensor.

Statement 49. The method of statement 40, further comprising:
forming the silicon substrate having the electron sensitive surface as a CMOS imager arranged to record time of arrival of photoelectron strikes.

Statement 50. The method of statement 40, further comprising:
forming the photocathode layer as a glass-bonded, thermally assisted negative affinity photocathode (TANEA), transmission mode photocathode.

Statement 51. The method of statement 40, further comprising:
forming the photocathode layer as a gallium arsenide (GaAs) absorber layer.

Statement 52. A method of making a vacuum proximity focused image sensor, comprising:
forming a photocathode window assembly having a photocathode layer;
forming an anode assembly comprising a silicon substrate having an electron sensitive surface;
forming a malleable metal seal bonding the photocathode window assembly and the silicon substrate to each other;
forming a vacuum gap that separates the photocathode layer of the photocathode window assembly and the electron sensitive surface of the silicon substrate of the anode assembly, the vacuum gap having a gap height defined by a thickness of the malleable metal seal;
forming a first electrical connection to the photocathode layer, for a voltage bias; and
forming a second electrical connection to the electron sensitive surface, for the voltage bias.

Statement 53. The method of statement 52, further comprising:
using precision tolerancing for the forming the vacuum gap, wherein the photocathode window assembly having the photocathode layer comprises a planar photocathode surface extending to an edge of the photocathode window assembly, and the thickness of the malleable metal seal specifies the vacuum gap with the precision tolerancing.

Statement 54. The method of statement 52, wherein the forming the malleable metal seal comprises:
forming the malleable metal seal such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 55. The method of statement 52, wherein the forming the first electrical connection comprises:
forming an electrically conductive path that transits the photocathode window assembly to specify an electrical potential of the photocathode layer.

Statement 56. The method of statement 52, wherein forming the first electrical connection comprises:
forming the first electrical connection using a Kovar™ wire.

Statement 57. The method of statement 52, wherein forming the malleable metal seal comprises:
forming the malleable metal seal comprising indium.

Statement 58. The method of statement 52, further comprising:
forming the silicon substrate having the electron sensitive surface as a backside thinned CMOS active pixel sensor, a backside thinned CCD image sensor, or a CMOS imager arranged to record time of arrival of photoelectron strikes.

Statement 59. The method of statement 52, further comprising:
forming the photocathode layer as a glass-bonded, thermally assisted negative affinity photocathode (TANEA), transmission mode photocathode or a gallium arsenide (GaAs) absorber layer.

Statement 60. A method of making an image sensor, comprising:
forming a photocathode window assembly having a photocathode layer;
forming an anode assembly comprising a silicon substrate having an electron sensitive surface;
bonding the photocathode window assembly and the silicon substrate to each other with a malleable metal seal;
forming a vacuum gap that separates the photocathode layer of the photocathode window assembly and the electron sensitive surface of the silicon substrate of the anode assembly;
forming a first electrical connection to the photocathode layer; and
forming a second electrical connection to the electron sensitive surface, wherein the first electrical connection and the second electrical connection are for voltage bias of the photocathode layer and the electron sensitive surface.

Statement 61. The method of making an image sensor of statement 60, wherein:
the forming the vacuum gap uses precision tolerancing;
the photocathode window assembly having the photocathode layer comprises a planar photocathode surface extending to an edge of the photocathode window assembly; and
the thickness of the malleable metal seal specifies the vacuum gap with the precision tolerancing.

Statement 62. The method of making an image sensor of statement 60, wherein the forming the vacuum gap relies on a face of the photocathode window assembly having one or more raised features that define a gap height of the vacuum gap.

Statement 63. The method of making an image sensor of statement 60, wherein the forming the vacuum gap relies on one or more raised features on a face of the photocathode window assembly to define a gap height of the vacuum gap, wherein the one or more raised features are integral with and formed of one or more materials of the face of the photocathode window assembly.

Statement 64. The method of making an image sensor of statement 60, further comprising:
forming one or more raised features on a face of the photocathode window assembly to define a gap height of the vacuum gap, wherein the one or more raised features are integral with and formed of one or more materials of the face of the photocathode window assembly.

Statement 65. The method of making an image sensor of statement 60, wherein the forming the malleable metal seal comprises:
forming the malleable metal seal such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 66. The method of making an image sensor of statement 60, wherein forming the first electrical connection comprises:
forming an electrically conductive path that transits the photocathode window assembly to specify an electrical potential of the photocathode layer.

Statement 67. The method of making an image sensor of statement 60, wherein the forming the first electrical connection comprises:
forming the first electrical connection using a Kovar™ wire.

Statement 68. The method of making an image sensor of statement 60, further comprising:
forming the malleable metal seal, comprising indium.

Statement 69. The method of making an image sensor of statement 60, further comprising:
forming the silicon substrate having the electron sensitive surface as a backside thinned CMOS active pixel sensor, a backside thinned CCD image sensor, or a CMOS imager arranged to record time of arrival of photoelectron strikes.

Statement 70. The method of making an image sensor of statement 60, further comprising:
forming the photocathode layer as a glass-bonded, thermally assisted negative affinity photocathode (TANEA), transmission mode photocathode or a gallium arsenide (GaAs) absorber layer.

Statement 71. A method of making a night vision device, comprising:
providing an image sensor; and
assembling a viewscreen, one or more processors and the image sensor, to form the night vision device, wherein the image sensor includes:
a photocathode window assembly having a photocathode layer;
an anode assembly comprising a silicon substrate having an electron sensitive surface;
a malleable metal seal bonding the photocathode window assembly and the silicon substrate to each other, forming a vacuum gap that separates the photocathode layer of the photocathode window assembly and the electron sensitive surface of the silicon substrate of the anode assembly;
a first electrical connection to the photocathode layer; and
a second electrical connection to the electron sensitive surface, wherein the first electrical connection and the second electrical connection are for voltage bias of the photocathode layer and the electron sensitive surface.

Statement 72. The method of making a night vision device of statement 71, wherein:
the photocathode window assembly having the photocathode layer comprises a planar photocathode surface extending to an edge of the photocathode window assembly; and
the thickness of the malleable metal seal specifies the vacuum gap with precision tolerancing.

Statement 73. The method of making a night vision device of statement 71, further comprising:
defining a gap height of the vacuum gap by one or more raised features of a face of the photocathode window assembly.

Statement 74. The method of making a night vision device of statement 71, further comprising:
defining a gap height of the vacuum gap by one or more raised features on a face of the photocathode window assembly, wherein the one or more raised features are integral with and formed of one or more materials of the face of the photocathode window assembly.

Statement 75. The method of making a night vision device of statement 71, wherein the malleable metal seal is such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 76. The method of making a night vision device of statement 71, wherein the first electrical connection to the photocathode layer comprises an electrically conductive path that transits the photocathode window assembly to specify an electrical potential of the photocathode layer.

Statement 77. The method of making a night vision device of statement 71, wherein the first electrical connection comprises a Kovar™ wire.

Statement 78. The method of making a night vision device of statement 71, wherein the malleable metal seal comprises indium.

Statement 79. The method of making a night vision device of statement 71, wherein the silicon substrate having the electron sensitive surface comprises a backside thinned CMOS active pixel sensor, a backside thinned CCD image sensor, or a CMOS imager arranged to record time of arrival of photoelectron strikes.

Statement 80. The method of making a night vision device of statement 71, wherein the photocathode layer comprises a glass-bonded, thermally assisted negative affinity photocathode (TANEA), transmission mode photocathode or a gallium arsenide (GaAs) absorber layer.

Statement 81. A low light level camera, comprising:
an optics assembly;
one or more processors; and
an image sensor, having:
a photocathode window assembly having a photocathode layer;
an anode assembly comprising a silicon substrate having an electron sensitive surface;
a malleable metal seal bonding the photocathode window assembly and the silicon substrate to each other, forming a vacuum gap that separates the photocathode layer of the photocathode window assembly and the electron sensitive surface of the silicon substrate of the anode assembly;
a first electrical connection to the photocathode layer; and
a second electrical connection to the electron sensitive surface, wherein the first electrical connection and the second electrical connection are for voltage bias of the photocathode layer and the electron sensitive surface.

Statement 82. The low light level camera of statement 81, wherein:
the photocathode window assembly having the photocathode layer comprises a planar photocathode surface extending to an edge of the photocathode window assembly; and
the thickness of the malleable metal seal specifies the vacuum gap with precision tolerancing.

Statement 83. The low light level camera of statement 81, further comprising:
a face of the photocathode window assembly having one or more raised features that define a gap height of the vacuum gap.

Statement 84. The low light level camera of statement 81, further comprising:
one or more raised features on a face of the photocathode window assembly, defining a gap height of the vacuum gap, wherein the one or more raised features are integral with and formed of one or more materials of the face of the photocathode window assembly.

Statement 85. The low light level camera of statement 81, wherein the malleable metal seal is formed such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 86. The low light level camera of statement 81, wherein the first electrical connection to the photocathode layer comprises an electrically conductive path that transits the photocathode window assembly to specify an electrical potential of the photocathode layer.

Statement 87. The low light level camera of statement 81, wherein the first electrical connection comprises a Kovar™ wire.

Statement 88. The low light level camera of statement 81, wherein the malleable metal seal comprises indium.

Statement 89. The low light level camera of statement 81, wherein the silicon substrate having the electron sensitive surface comprises a backside thinned CMOS active pixel sensor, a backside thinned CCD image sensor, or a CMOS imager arranged to record time of arrival of photoelectron strikes.

Statement 90. The low light level camera of statement 81, wherein the photocathode layer comprises a glass-bonded, thermally assisted negative affinity photocathode (TANEA), transmission mode photocathode or a gallium arsenide (GaAs) absorber layer.

Statement 91. A method of making a low light level camera, comprising:
providing an image sensor; and
assembling an optics assembly, one or more processors and the image sensor, to form the low light level camera, wherein the image sensor includes:
a photocathode window assembly having a photocathode layer;
an anode assembly comprising a silicon substrate having an electron sensitive surface;
a malleable metal seal bonding the photocathode window assembly and the silicon substrate to each other, forming a vacuum gap that separates the photocathode layer of the photocathode window assembly and the electron sensitive surface of the silicon substrate of the anode assembly;
a first electrical connection to the photocathode layer; and
a second electrical connection to the electron sensitive surface, wherein the first electrical connection and the second electrical connection are for voltage bias of the photocathode layer and the electron sensitive surface.

Statement 92. The method of making a low light camera of statement 91, wherein:
the photocathode window assembly having the photocathode layer comprises a planar photocathode surface extending to an edge of the photocathode window assembly; and
the thickness of the malleable metal seal specifies the vacuum gap with precision tolerancing.

Statement 93. The method of making a low light camera of statement 91, further comprising:
defining a gap height of the vacuum gap by one or more raised features of a face of the photocathode window assembly.

Statement 94. The method of making a low light camera of statement 91, further comprising:
defining a gap height of the vacuum gap by one or more raised features on a face of the photocathode window assembly, wherein the one or more raised features are integral with and formed of one or more materials of the face of the photocathode window assembly.

Statement 95. The method of making a low light camera of statement 91, wherein the malleable metal seal is such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

Statement 96. The method of making a low light camera of statement 91, wherein the first electrical connection to the photocathode layer comprises an electrically conductive path that transits the photocathode window assembly to specify an electrical potential of the photocathode layer.

Statement 97. The method of making a low light camera of statement 91, wherein the first electrical connection comprises a Kovar™ wire.

Statement 98. The method of making a low light camera of statement 91, wherein the malleable metal seal comprises indium.

Statement 99. The method of making a low light camera of statement 91, wherein the silicon substrate having the electron sensitive surface comprises a backside thinned CMOS active pixel sensor, a backside thinned CCD image sensor, or a CMOS imager arranged to record time of arrival of photoelectron strikes.

Statement 100. The method of making a low light camera of statement 91, wherein the photocathode layer comprises a glass-bonded, thermally assisted negative affinity photocathode (TANEA), transmission mode photocathode or a gallium arsenide (GaAs) absorber layer.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A vacuum proximity focused image sensor comprising:
   a photocathode window assembly having a face with one or more raised features and a photocathode layer;
   an anode assembly comprising a silicon substrate having an electron sensitive surface;
   a malleable metal seal bonding the photocathode window assembly and the silicon substrate to each other, forming a vacuum gap that separates the photocathode layer of the photocathode window assembly and the electron sensitive surface of the silicon substrate of the anode assembly by a gap height defined by the one or more raised features of the face of the photocathode window assembly;
   a first electrical connection to the photocathode layer, for a voltage bias; and
   a second electrical connection to the electron sensitive surface, for the voltage bias;
   wherein the malleable metal seal is formed such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

2. The vacuum proximity focused image sensor of claim 1, wherein the one or more raised features are integral with and formed of one or more materials of the face of the photocathode window assembly.

3. The vacuum proximity focused image sensor of claim 1, wherein the first electrical connection to the photocathode layer comprises an electrically conductive path that transits the photocathode window assembly to specify an electrical potential of the photocathode layer.

4. The vacuum proximity focused image sensor of claim 1, wherein the first electrical connection comprises a wire composed of an alloy comprising iron, nickel, and cobalt with less than 0.3% manganese, less than 0.2% silicon, and less than 0.01% carbon.

5. The vacuum proximity focused image sensor of claim 1, wherein the malleable metal seal comprises indium.

6. The vacuum proximity focused image sensor of claim 1, wherein the silicon substrate having the electron sensitive surface comprises a backside thinned CMOS active pixel sensor.

7. The vacuum proximity focused image sensor of claim 1, wherein the silicon substrate having the electron sensitive surface comprises a backside thinned CCD image sensor.

8. The vacuum proximity focused image sensor of claim 1, wherein the silicon substrate having the electron sensitive surface comprises a CMOS imager arranged to record time of arrival of photoelectron strikes.

9. The vacuum proximity focused image sensor of claim 1, wherein the photocathode layer comprises a glass-bonded, thermally assisted negative affinity photocathode (TANEA), transmission mode photocathode.

10. The vacuum proximity focused image sensor of claim 1, wherein the photocathode layer comprises a gallium arsenide (GaAs) absorber layer.

11. A vacuum proximity focused image sensor comprising:
    a photocathode window assembly having a photocathode layer;
    an anode assembly comprising a silicon substrate having an electron sensitive surface;
    a malleable metal seal bonding the photocathode window assembly and the silicon substrate to each other, forming a vacuum gap that separates the photocathode layer of the photocathode window assembly and the electron sensitive surface of the silicon substrate of the anode assembly, the vacuum gap having a gap height defined by a thickness of the malleable metal seal;
    a first electrical connection to the photocathode layer, for a voltage bias; and
    a second electrical connection to the electron sensitive surface, for the voltage bias.

12. The vacuum proximity focused image sensor of claim 11, wherein:
    the photocathode window assembly having the photocathode layer comprises a planar photocathode surface extending to an edge of the photocathode window assembly; and
    the thickness of the malleable metal seal specifies the vacuum gap with precision tolerancing.

13. The vacuum proximity focused image sensor of claim 11, wherein the malleable metal seal is formed such that a first end of the first electrical connection is at the photocathode layer, a second end of the first electrical connection is outside the vacuum gap, a first end of the second electrical connection is at the electron sensitive surface, and a second end of the second electrical connection is outside the vacuum gap.

14. The vacuum proximity focused image sensor of claim 11, wherein the first electrical connection to the photocathode layer comprises an electrically conductive path that transits the photocathode window assembly to specify an electrical potential of the photocathode layer.

15. The vacuum proximity focused image sensor of claim 11, wherein the first electrical connection comprises a wire composed of an alloy comprising iron, nickel, and cobalt with less than 0.3% Manganese, less than 0.2% silicon, and less than 0.01% carbon.

16. The vacuum proximity focused image sensor of claim 11, wherein the malleable metal seal comprises indium.

17. The vacuum proximity focused image sensor of claim 11, wherein the silicon substrate having the electron sensitive surface comprises a backside thinned CMOS active pixel sensor, a backside thinned CCD image sensor, or a CMOS imager arranged to record time of arrival of photoelectron strikes.

18. The vacuum proximity focused image sensor of claim 11, wherein the photocathode layer comprises a glass-bonded, thermally assisted negative affinity photocathode (TANEA), transmission mode photocathode or a gallium arsenide (GaAs) absorber layer.

\* \* \* \* \*